United States Patent
Abraham et al.

(10) Patent No.: US 10,996,267 B2
(45) Date of Patent: May 4, 2021

(54) TIME INTERLEAVED SCAN SYSTEM

(71) Applicant: QUALCOMM Incorporated, San Diego, CA (US)

(72) Inventors: Jais Abraham, Bangalore (IN); Punit Kishore, Bangalore (IN)

(73) Assignee: QUALCOMM INCORPORATED, San Diego, CA (US)

(*) Notice: Subject to any disclaimer, the term of this patent is extended or adjusted under 35 U.S.C. 154(b) by 0 days.

(21) Appl. No.: 16/255,214

(22) Filed: Jan. 23, 2019

(65) Prior Publication Data
US 2020/0233031 A1    Jul. 23, 2020

(51) Int. Cl.
*G01R 31/317* (2006.01)
*G01R 31/3185* (2006.01)

(52) U.S. Cl.
CPC . *G01R 31/31701* (2013.01); *G01R 31/31715* (2013.01); *G01R 31/31721* (2013.01); *G01R 31/31725* (2013.01); *G01R 31/31727* (2013.01); *G01R 31/318552* (2013.01); *G01R 31/318594* (2013.01)

(58) Field of Classification Search
CPC ........ G01R 31/31701; G01R 31/31715; G01R 31/31721; G01R 31/31725; G01R 31/31727; G01R 31/318552; G01R 31/318594
USPC ................. 710/25, 38, 45, 58, 117
See application file for complete search history.

(56) References Cited

U.S. PATENT DOCUMENTS

| | | | | |
|---|---|---|---|---|
| 5,101,203 A | * | 3/1992 | Gersbach | H03M 9/00 341/100 |
| 6,862,296 B1 | * | 3/2005 | Desai | H04L 7/042 341/100 |
| 7,492,291 B2 | * | 2/2009 | Murray | H03M 5/145 341/100 |
| 7,571,267 B1 | * | 8/2009 | Luis | G06F 13/4291 710/61 |
| 7,587,537 B1 | * | 9/2009 | Burney | H04L 63/1408 710/71 |
| 7,983,308 B1 | * | 7/2011 | Johnston | H04J 3/0608 370/514 |
| 2002/0150127 A1 | * | 10/2002 | Heinen | H04J 3/0608 370/503 |
| 2003/0030576 A1 | * | 2/2003 | Pitio | H03M 9/00 341/101 |
| 2005/0286643 A1 | * | 12/2005 | Ozawa | H03L 7/087 375/242 |
| 2009/0296867 A1 | * | 12/2009 | Do | H04L 7/033 375/371 |
| 2011/0087943 A1 | * | 4/2011 | Mangione-Smith | G06F 13/4022 714/748 |
| 2012/0269206 A1 | * | 10/2012 | Zid | H03M 9/00 370/535 |

(Continued)

*Primary Examiner* — Idriss N Alrobaye
*Assistant Examiner* — Henry W Yu
(74) *Attorney, Agent, or Firm* — Patterson+Sheridan, L.L.P.

(57) ABSTRACT

Certain aspects of the present disclosure provide a circuit for testing processor cores. For example, certain aspects provide a circuit having a deserializer having at least one input coupled to at least one input node of the circuit and having a first plurality of outputs, a plurality of processor cores having inputs coupled to the first plurality of outputs of the deserializer, and a serializer having inputs coupled to a second plurality of outputs of the plurality of processor cores.

18 Claims, 5 Drawing Sheets

(56) References Cited

U.S. PATENT DOCUMENTS

2015/0036783 A1\* 2/2015 Chen .............. G01R 31/318544
　　　　　　　　　　　　　　　　　　　　377/19

\* cited by examiner

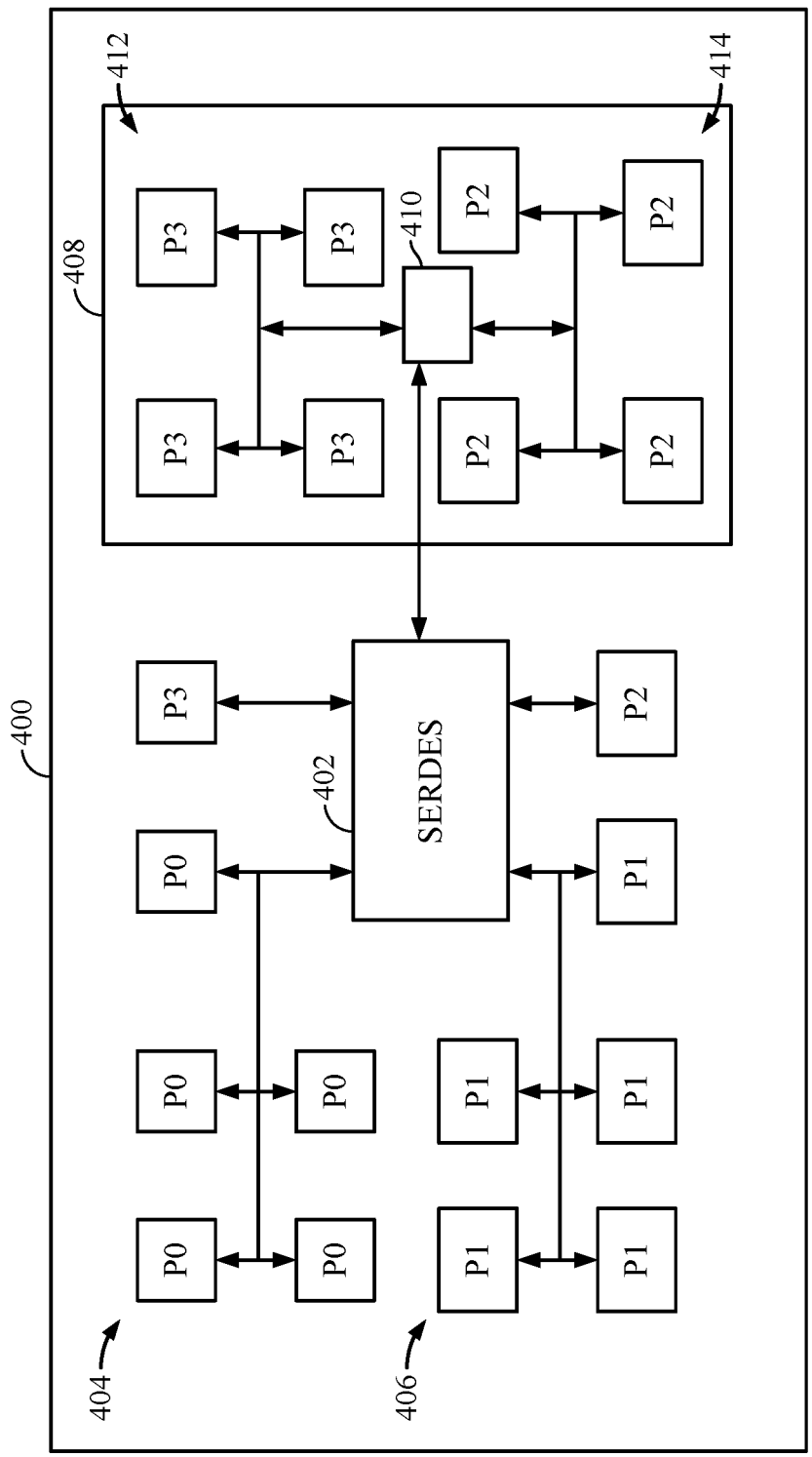
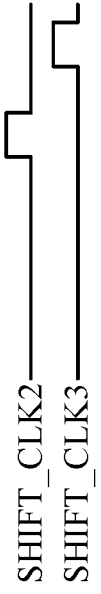
FIG. 4A
FIG. 4B

TIME INTERLEAVED SCAN SYSTEM

TECHNICAL FIELD

The teachings of the present disclosure relate generally to testing systems, and more particularly, to an interleaved testing system.

INTRODUCTION

Processors are used extensively today in almost every electronic application. The processor controls the execution of program instructions, arithmetic functions, and access to memory and peripherals. In the simplest form, the processor executes program instructions by performing one or more arithmetic functions on data stored in memory. Processors may include shift registers, which include a cascade of flip flops, sharing the same clock, in which the output of each flip-flop is connected to the data input of the next flip-flop in the chain.

BRIEF SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure are generally directed to circuitry for testing one or more processor cores.

Certain aspects provide a circuit that generally includes a deserializer having at least one input coupled to at least one input node of the circuit and having a first plurality of outputs, a plurality of processor cores having inputs coupled to the first plurality of outputs of the deserializer, and a serializer having inputs coupled to a second plurality of outputs of the plurality of processor cores.

Certain aspects provide a circuit that generally includes a deserializer configured to receive at least one input signal and generate a first plurality of output signals based on the at least one input signal, each of the first plurality of output signals having different phases, a plurality of processor cores configured to receive the first plurality of output signals generated by the deserializer and generate a second plurality of output signals, and a serializer configured to receive the second plurality of output signals generated by the plurality of processor cores and generate at least one output signal.

Certain aspects provide a method for testing a plurality of processor cores. The method generally includes deserializing at least one input signal to generate a first plurality of output signals, receiving the first plurality of output signals at inputs of a plurality of processor core, generating, via the plurality of processor cores, a second plurality of output signals, and serializing the second plurality of output signal to generate at least one output signal for the testing of the plurality of processor cores.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 4A is an architecture having processor cores, in accordance with certain aspects of the present disclosure.

FIG. 4B illustrates timing diagrams of clock signals, in accordance with certain aspects of the present disclosure.

DETAILED DESCRIPTION

Figure 1:
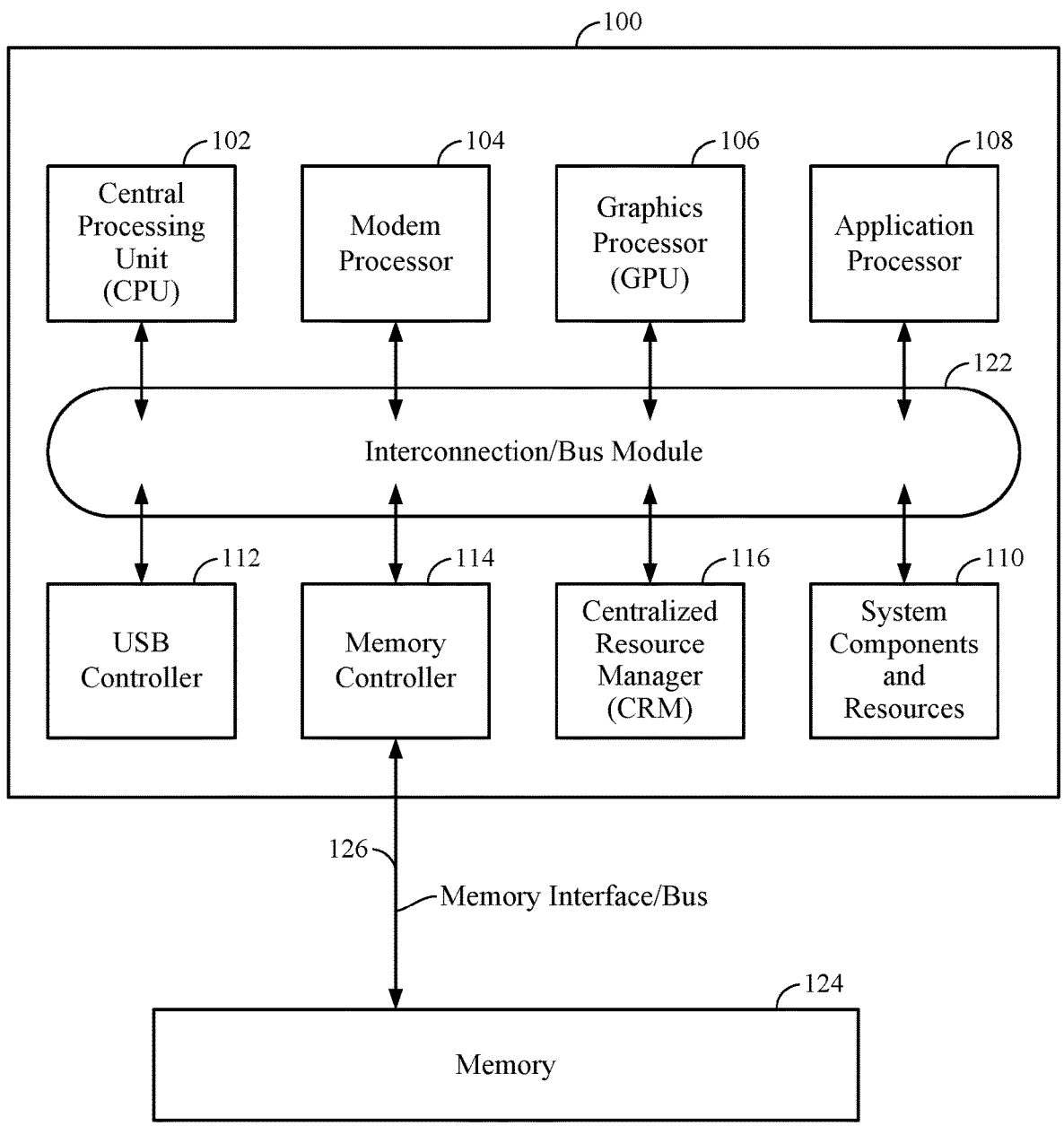
FIG. 1 is an illustration of an exemplary system-on-chip (SoC) integrated circuit design, in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., ROM, RAM, flash, etc.), and resources (e.g., timers, voltage regulators, oscillators, etc.), any or all of which may be included in one or more cores.

A number of different types of memories and memory technologies are available or contemplated in the future, all of which are suitable for use with the various aspects of the present disclosure. Such memory technologies/types include dynamic random-access memory (DRAM), static random-access memory (SRAM), non-volatile random-access memory (NVRAM), flash memory (e.g., embedded multimedia card (eMMC) flash), pseudostatic random-access memory (PSRAM), double data rate synchronous dynamic random-access memory (DDR SDRAM), and other random-access memory (RAM) and read-only memory (ROM) technologies known in the art. A DDR SDRAM memory may be a DDR type 1 SDRAM memory, DDR type 2 SDRAM memory, DDR type 3 SDRAM memory, or a DDR type 4 SDRAM memory. Each of the above-mentioned memory technologies includes, for example, elements suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture (e.g., CoreConnect, AMBA, etc.). Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 (e.g., a DRAM) via a memory interface/bus 126. Certain aspects of the present disclosure are generally directed to a memory implemented using negative capacitance material. For example, the memory 124 may be a DRAM implemented using negative capacitance material, improving the operation efficiency and/or reducing the size of the DRAM, as described in more detail herein.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Example Time Interleaved Scan System

Testing of processor cores may be implemented by loading a certain pattern onto shift registers of each of the processor cores across a range of frequencies and supply voltage levels, and reading the shift registers to determine whether any of the processor cores experienced any errors. The frequency of the signal provided to each of the processor cores may be at 100 Mhz or less since the scan shift timing closure for a system on chip (SoC) at higher frequencies becomes challenging. Moreover, having higher scan shift frequencies results in additional area and leakage overheads for the SoC and may create voltage drop issues. However, a test equipment (also referred to as a "tester") is able provide signals at much higher frequencies (e.g. 800 MHz to 1.6 GHz). The current scan architectures are not able to exploit the higher frequency provided by the tester on account of the challenges mentioned above.

Certain aspects of the present disclosure address these issues by providing a scheme that allows the SoC to exploit the complete bandwidth of the tester while not imposing additional constraints on the SoC shift speeds. Certain aspects of the present disclosure may provide up to 60-70% reduction on the scan test cost (e.g., in terms of test time), which can translate to a 30-40% reduction of the overall device test cost.

Figure 2:
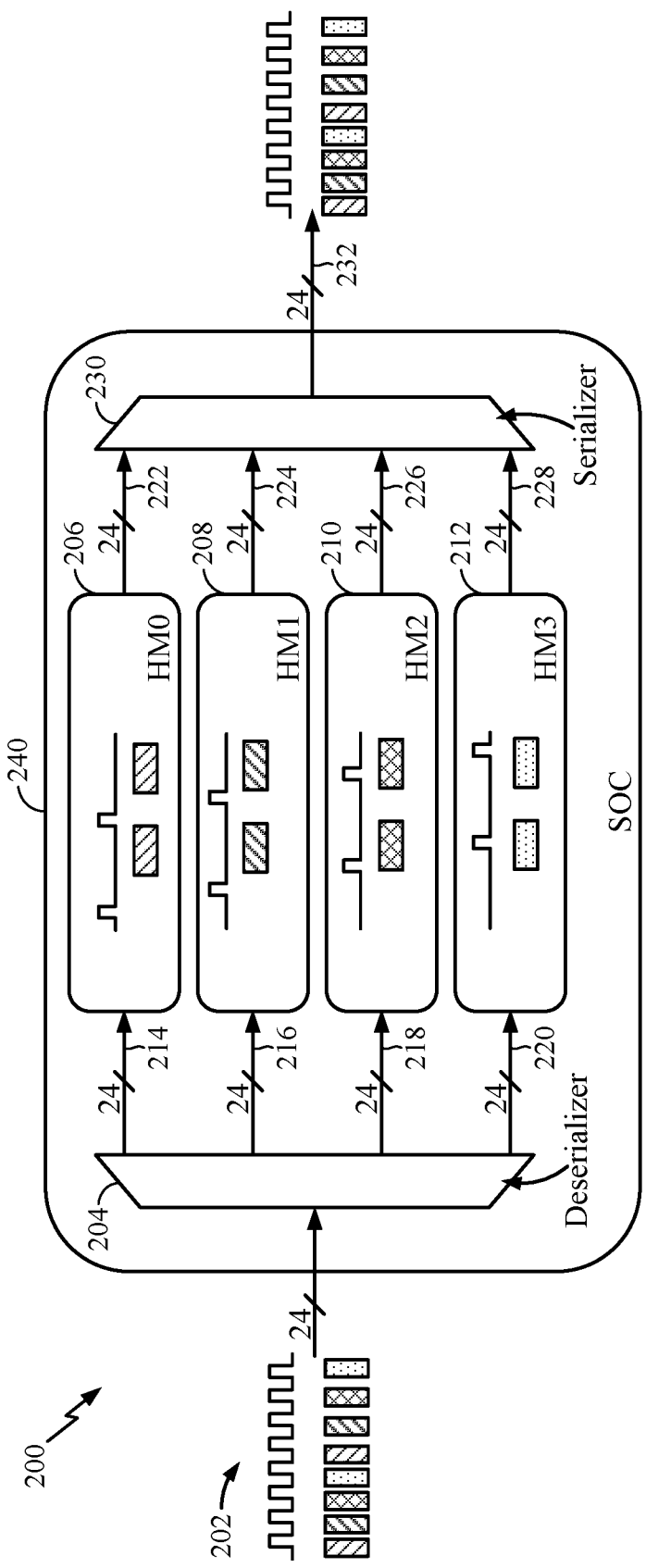
FIG. 2 is a scan architecture for testing processor cores, in accordance with certain aspects of the present disclosure.

FIG. 2 is a scan architecture 200 for testing processor cores, in accordance with certain aspects of the present disclosure. The scan architecture 200 includes a serializer/deserializer (SERDES) like structure that receives the high speed data streaming from the test equipment and partitions the high speed data into multiple parallel phases of data of lower frequencies.

On the output side, the SERDES scheme gathers the different phases of low frequency scan response data and creates a high speed stream that is provided to the test equipment to determine whether each processor core has experienced any errors. For example, the deserializer 204 receives test signals 202 from the test equipment. The test signals may be provided via multiple parallel paths (e.g., 24 parallel paths), as illustrated. The deserializer 204 may generate four separate paths 214, 216, 218, 220, each of the four signal paths having multiple parallel subpaths (e.g., 24 subpaths). The four parallel paths 214, 216, 218, 220, each having 24 subpaths, may have a lower frequency than the test signal 202.

Each of the four parallel paths 214, 216, 218, 220 may be used to test one or more processors cores of the SoC 240. For example, the four parallel paths 214, 216, 218, 220 may be provided to processors cores 206, 208, 210, 212, respectively. Data stored in shift registers of each of the processor cores 206, 208, 210, and 212 based on the signals from the parallel paths 214, 216, 218, 220 are then read out via output paths 222, 224, 226, 228, which are serialized via the serializer 230 to generate a signal at path 232 to be provided to the tester. This architecture described herein does not impose additional timing closure penalties on the SoC as it restricts the high speed logic only to the SERDES controller while the rest of the SoC continues to work at lower shift frequencies.

In certain aspects, the clocking architecture of the present disclosure may provide for clock phases that are staggered such that clock overlaps are reduced, and hence, the power droops due to clock edge alignments are reduced. Test cost benefits can be achieved because techniques provided herein enable multiple cores to shift at the same time.

Figure 3:
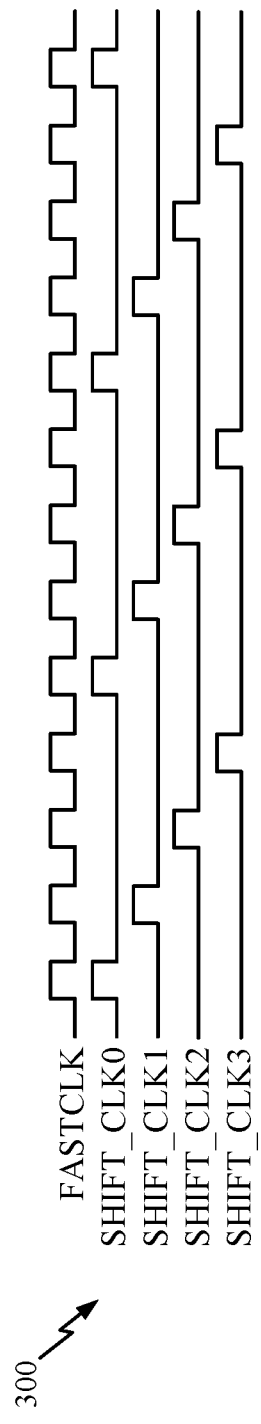
FIG. 3 illustrates a clocking scheme corresponding to the scan architecture of FIG. 2, in accordance with certain aspects of the present disclosure.

FIG. 3 illustrates a clocking scheme 300 corresponding to the scan architecture 200, in accordance with certain aspects of the present disclosure. The fast clock (FASTCLK) has a high frequency which represents the timing of the test signal 202 generated by the test equipment. The shift clocks (SHIFT_CLK0, SHIFT_CLK1, SHIFT_CLK2, SHIFT_CLK3) have a lower frequency and a lower duty cycle than the frequency and duty cycle (50%) of the fast clock. The four shift clocks represent the timing of the signals on paths 214, 216, 218, 220, respectively.

As illustrated, the on time (e.g., time between rising and falling edges) of the shift clocks are staggered in order to reduce the power consumption of the SoC 240 when multiple processor cores are shifting. For example, SHIFT_CLK0 may have digital signal component at a first phase (P0), SHIFT_CLK1 may have digital signal component at a second phase (P1), the SHIFT_CLK2 may have digital signal component at a third phase (P2), and the SHIFT_CLK3 may have digital signal component at a fourth phase (P3). By staggering the on time of the shift clocks for the signals on paths 214, 216, 218, 220, the shift registers of the different processor cores 206, 208, 210, 212 shift at different times, preventing increased power consumption at any point in time.

FIG. 4A is an architecture 400 of processor cores, in accordance with certain aspects of the present disclosure. As illustrated, the scan architecture 400 includes a SERDES module 402, which may include a serializer and deserializer as described with respect to FIG. 2. The SERDES module 402 may receive a high speed data stream from the test equipment and partition the high speed data stream into multiple parallel phases of data of lower frequencies. In certain aspects, each of the multiple parallel phases of data may be provided to multiple processors cores. For example, the data streams having digital signal components at a first phase (P0) may be provided to processor cores 404 and the data streams having digital signal components at a second phase (P1) may be provided to processor cores 406, as illustrated.

In certain aspects, the architecture 400 may include a processor unit 408 (e.g., a graphic processor unit) that may be segregated from other processor cores of the architecture 400. Thus, one or more phases of the low frequency data streams may be assigned to the processor unit 408. For example, the processor unit 408 may include another SERDES 410 which may receive signals from the SERDES module 402 having digital signal components at phases P2 and P3. The SERDES 410 may partition the signals received from the SERDES 410 to generate signals having different phases P2 and P3, which may be provided to different processor cores 412, 414 of the processor unit 408. In other words, instead of the SERDES module 402 generating four partitions of the high speed data stream from the test equipment requiring separate routings from the SERDES module 402 to the processor unit 408, the SERDES module 402 may generate and send a partition (signal) having both phases P2 and P3 to the SERDES 410, reducing the number of traces to be routed to the processor unit 408. The SERDES 410 of the processor unit 408 then partitions the signal having both phases P2 and P3 into separate signals for phases P2 and P3 for testing the processor cores 412, 414, as illustrated. For example, as illustrated in FIG. 4B, the SERDES module 402 generates at least SHIFT_CLK0 and SHIFT_CLK1 having digital signal components at phases P0 and P1, respectively, for testing processor cores 404, 406. The SERDES module 402 also generates the signal SHIFT_CLK2/3 having digital signal components at both phases P2 and P3, which is sent to the SERDES 410, based on which the SERDES 410 generates SHIFT_CLK2 and SHIFT_CLK3 for testing processor cores 412, 414.

Figure 5A:
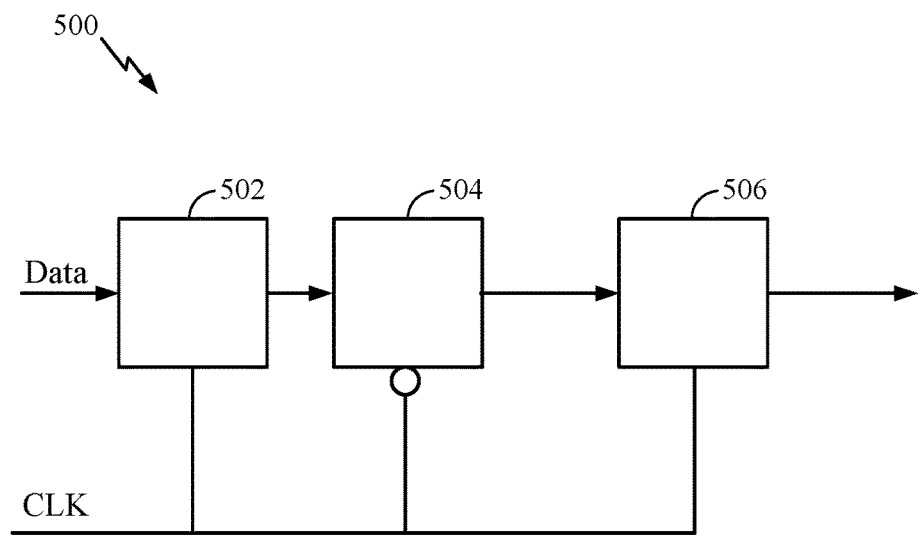
FIGS. 5A and 5B are example of shift registers, in accordance with certain aspects of the present disclosure.
Figure 5B:
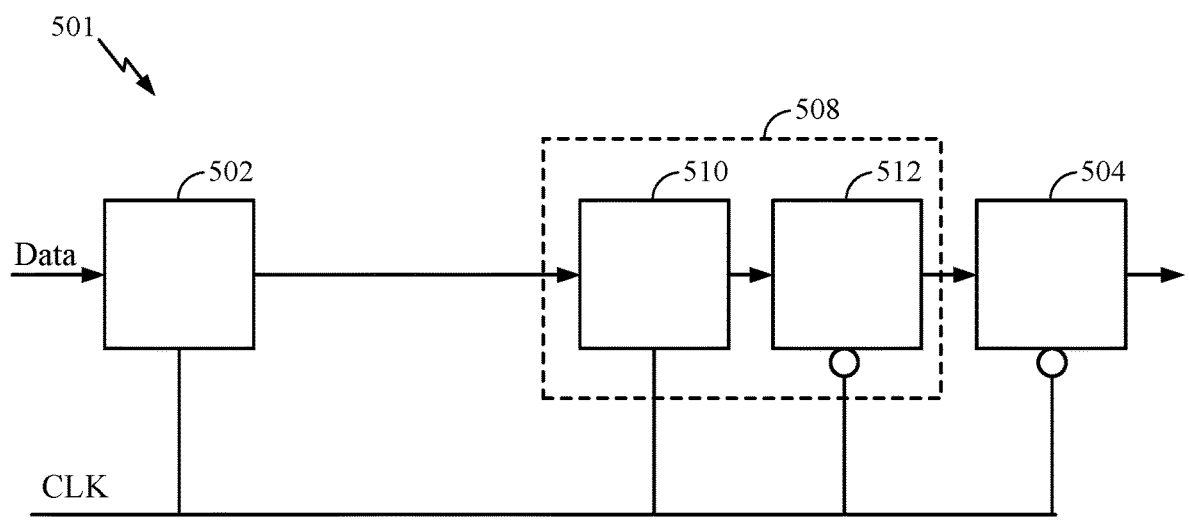

FIGS. 5A and 5B are example of shift registers 500, 501, in accordance with certain aspects of the present disclosure. As illustrated, the shift register 500 includes a flip-flop (FF) 502, FF 504, and a FF 506. The FFs 502, 506 may be operated on a clock signal and the FF 504 may be operated on an inverse of the CLK signal, as illustrated. Thus, the FFs 502, 506 may trigger on a rising edge of the CLK signal and the FF 504 may trigger on a falling edge of the CLK signal.

Since the rising edge and the falling edge of the shift clocks generated by the SERDES scheme, as described herein, occur close in time, there may not be enough time after the rising edge of the CLK signal for the FF 504 to properly trigger if the FFs 502, 504 are not in close proximity with each other. Thus, in certain aspects, the FFs 502, 504 may be implemented in close proximity to each other, as illustrated in FIG. 5A. By implementing the FFs 502, 504 closer to each other, the signal at the input of the FF 504 stabilizes to the correct logic state more quickly. Therefore, the FFs 502, 504 may be implemented in close proximity to each other in order to properly operate given the fast timing between rising and falling edges of the shift clocks. In other words, the FFS 502, 504 may be designed into a single library cell to get the maximum benefit for timing.

In certain aspects, the FFs 502, 504 may not be in close proximity to each other. In this case, a FF pair 508 having FFs 510, 512 may be implemented close to the FF 504, as illustrated in FIG. 5B. Thus, any FF that triggers on a rising edge of the clock signal is in close proximity to a subsequent and adjacent FF that triggers on a falling edge of the clock signal.

Figure 6:
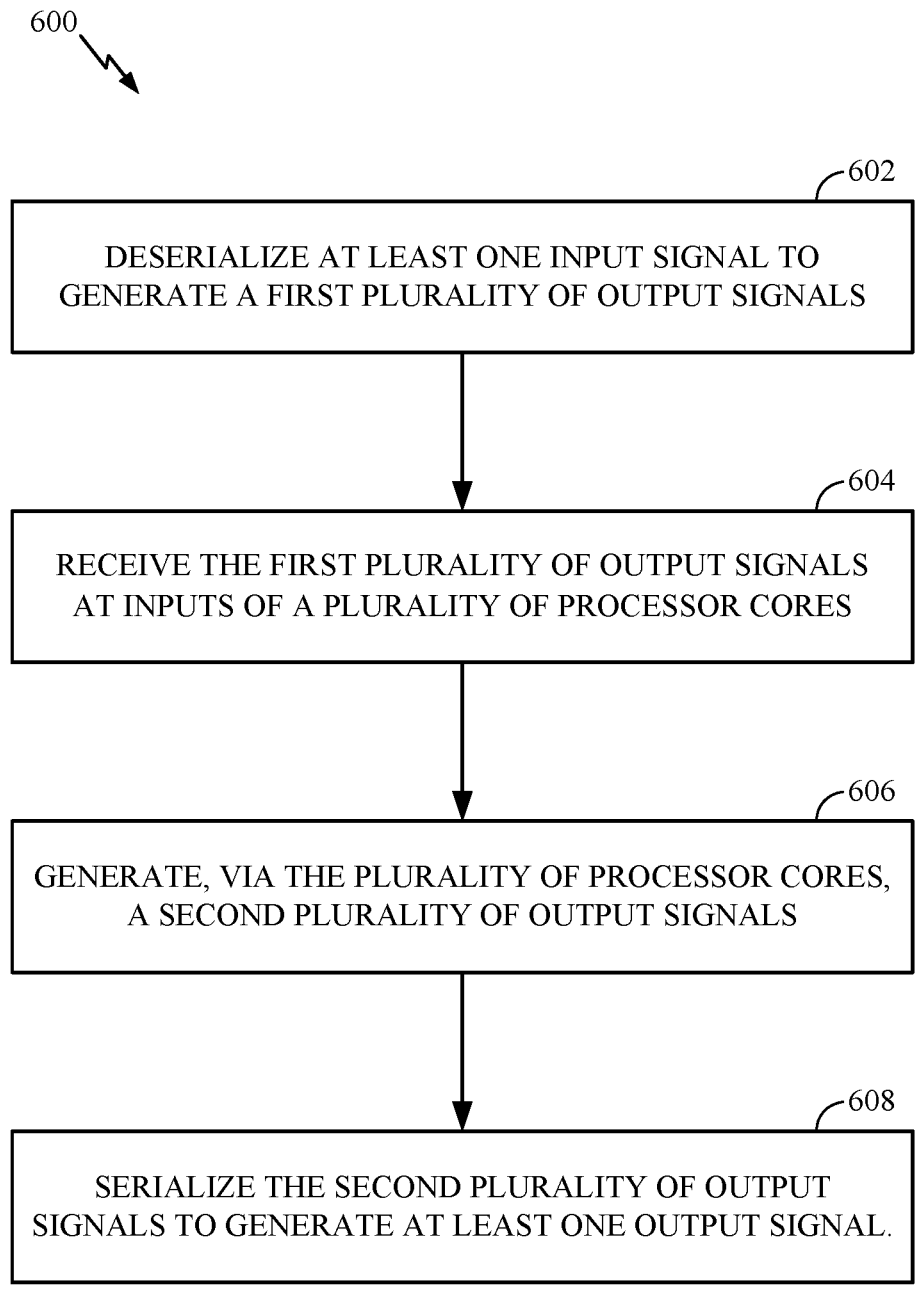
FIG. 6 is a flow diagram of example operations for processor core testing, in accordance with certain aspects of the present disclosure.

FIG. 6 is a flow diagram illustrating example operations 600 for processor core testing, in accordance with certain aspects of the present disclosure. The operations 600 may be performed by a scanning system as described herein.

The operations 600 begin, at block 602, by deserializing (e.g., via the deserializer 204) at least one input signal to generate a first plurality of output signals, and at block 604, receiving the first plurality of output signals at inputs of a plurality of processor cores (e.g., processor cores 206, 208, 210, 212). In certain aspects, each of the first plurality of output signals having different phases. At block 606, the scanning system generates, via the plurality of processor cores, a second plurality of output signals, and at block 608, serializes (e.g., via the serializer 230) the second plurality of output signals to generate at least one output signal. In certain aspects, receiving the first plurality of output signals comprises receiving a set of the first plurality of output signals via each processor core of the plurality of processor cores, and generating the second plurality of output signals comprises generating a set of the second plurality of output signals via the processor core.

In certain aspects, the operations 600 also include providing each of the set of the first plurality of output signals to a shift register of the processor core. In certain aspects, the deserializing the at least one input signal comprises generating a first signal (e.g., SHIFT_CLK0 described with respect to FIG. 4B) having a digital signal component at a first phase, and a second signal (SHIFT_CLK2/3 described with respect to FIG. 4B) having a digital signal component at a second phase and a digital signal component at a third phase. In this case, the operations 600 also include generating, via another deserializer (e.g., deserializer of SERDES 410), a third plurality of output signals (e.g., SHIFT_CLK2 and SHIFT_CLK3) for another plurality of processor cores based on the second signal.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein. The algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, b-b-b, b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A circuit, comprising:
 a deserializer having at least one input coupled to at least one input node of the circuit and having a first plurality of outputs, wherein:

the deserializer is configured to generate signals having different phases based on at least one signal at the at least one input;

the at least one signal at the at least one input comprises a clock signal; and the signals generated by the deserializer are clock signals having different phases;

a plurality of processor cores having inputs coupled to the first plurality of outputs of the deserializer; and a serializer having inputs coupled to a second plurality of outputs of the plurality of processor cores.

2. The circuit of claim 1, wherein each processor core of the plurality of processor cores is coupled to a set of the first plurality of outputs of the deserializer.

3. The circuit of claim 2, wherein each of the set of the first plurality of outputs is coupled to a shift register of the processor core.

4. The circuit of claim 3, wherein the shift register comprises a first flip-flop (FF) configured to receive one of the clock signals generated by the deserializer and a second FF configured to receive an inverse of the one of the clock signals generated by the deserializer.

5. The circuit of claim 4, wherein the shift register further comprises:

a third FF configured to receive the one of the clock signals generated by the deserializer and having an input coupled to an output of the first FF; and a fourth FF configured to receive the inverse of the one of the clock signals generated by the deserializer and having an input coupled to an output of the third FF and having an output coupled to an input of the second FF.

6. The circuit of claim 5, wherein the third FF is in close proximity to the fourth FF.

7. The circuit of claim 1, wherein:

the deserializer is configured to generate:

a first signal having a digital signal component at a first phase; and a second signal having a digital signal component at a second phase and a digital signal component at a third phase; and the circuit further comprises another deserializer configured to receive the second signal, and generate a third plurality of output signals based on the second signal to be provided to another plurality of processor cores.

8. A circuit, comprising:

a deserializer configured to receive at least one input signal and generate a first plurality of output signals based on the at least one input signal, wherein:

the at least one input signal comprises a clock signal; and the first plurality of output signals are clock signals having different phases;

a plurality of processor cores configured to receive the first plurality of output signals generated by the deserializer and generate a second plurality of output signals; and a serializer configured to receive the second plurality of output signals generated by the plurality of processor cores and generate at least one output signal.

9. The circuit of claim 8, wherein each processor core of the plurality of processor cores is configured to receive a set of the first plurality of output signals generated by the deserializer and generate a set of the second plurality of output signals.

10. The circuit of claim 9, wherein each of the set of the first plurality of output signals is provided to a shift register of the processor core.

11. The circuit of claim 10, wherein the shift register comprises a first flip-flop (FF) configured to receive one of the clock signals generated by the deserializer and a second FF configured to receive an inverse of the one of the clock signals generated by the deserializer.

12. The circuit of claim 11, wherein the shift register further comprises:

a third FF configured to receive the one of the clock signals generated by the deserializer and having an input coupled to an output of the first FF; and a fourth FF configured to receive the inverse of the one of the clock signals generated by the deserializer and having an input coupled to an output of the third FF and having an output coupled to an input of the second FF.

13. The circuit of claim 12, wherein the third FF is in close proximity to the fourth FF.

14. The circuit of claim 8, wherein:

the deserializer is configured to generate:

a first signal having a digital signal component at a first phase; and a second signal having a digital signal component at a second phase and a digital signal component at a third phase; and the circuit further comprises another deserializer configured to receive the second signal and generate a third plurality of output signals for another plurality of processor cores.

15. A method for processor core testing, comprising:

deserializing at least one input signal to generate a first plurality of output signals, wherein:

the at least one input signal comprises a clock signal; and the first plurality of output signals are clock signals having different phases;

receiving the first plurality of output signals at inputs of a plurality of processor cores;

generating, via the plurality of processor cores, a second plurality of output signals; and serializing the second plurality of output signal to generate at least one output signal.

16. The method of claim 15, wherein:

receiving the first plurality of output signals comprises receiving a set of the first plurality of output signals via each processor core of the plurality of processor cores; and generating the second plurality of output signals comprises generating a set of the second plurality of output signals via the processor core.

17. The method of claim 16, further comprising providing each of the set of the first plurality of output signals to a shift register of the processor core.

18. The method of claim 15, wherein:

deserializing the at least one input signal comprises generating a first signal having a digital signal component at a first phase, and a second signal having a digital signal component at a second phase and a digital signal component at a third phase; and the method further comprises generating, via another deserializer, a third plurality of output signals for another plurality of processor cores based on the second signal.

* * * * *